United States Patent
Teng

(10) Patent No.: US 6,410,208 B1
(45) Date of Patent: Jun. 25, 2002

(54) LITHOGRAPHIC PRINTING PLATES HAVING A THERMO-DEACTIVATABLE PHOTOSENSITIVE LAYER

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

(21) Appl. No.: 09/837,130

(22) Filed: Apr. 18, 2001

(51) Int. Cl.[7] ................ G03F 7/038; G03F 7/039
(52) U.S. Cl. ............ 430/302; 430/303; 430/348; 430/944; 430/945; 430/964; 101/463.1
(58) Field of Search ............... 430/302, 303, 430/270.1, 271.1, 272.1, 273.1, 281.1, 286.1, 287.1, 288.1, 944, 945, 348, 964; 101/463.1, 465

(56) References Cited

U.S. PATENT DOCUMENTS

| | | | |
|---|---|---|---|
| 4,132,168 A | | 1/1979 | Petersen ............ 101/471 |
| 5,379,698 A | | 1/1995 | Nowak et al. ......... 101/454 |
| 5,491,046 A | | 2/1996 | DeBoer et al. ........ 430/302 |
| 5,616,449 A | | 4/1997 | Cheng et al. ......... 430/302 |
| 5,674,658 A | | 10/1997 | Burbery et al. ....... 430/262 |
| 5,677,106 A | | 10/1997 | Burbery et al. ....... 430/253 |
| 5,677,110 A | | 10/1997 | Chia et al. .......... 430/302 |
| 5,705,309 A | * | 1/1998 | West et al. .......... 430/167 |
| 5,759,742 A | * | 6/1998 | West et al. ......... 430/278.1 |
| 5,858,604 A | * | 1/1999 | Takeda et al. ........ 430/162 |
| 5,942,372 A | * | 8/1999 | West et al. ......... 430/281.1 |
| 5,955,238 A | | 9/1999 | Yokoya et al. ........ 430/166 |
| 6,014,929 A | | 1/2000 | Teng ................ 101/456 |
| 6,071,675 A | | 6/2000 | Teng ................ 430/302 |
| 6,117,610 A | | 9/2000 | Sheriff et al. ........ 430/190 |
| 6,143,451 A | * | 11/2000 | Blanchet-Fincher ...... 430/11 |
| 6,153,353 A | * | 11/2000 | Van Damme et al. .... 430/270.1 |
| 6,165,679 A | * | 12/2000 | Van Damme et al. .... 430/270.1 |
| 6,165,691 A | * | 12/2000 | Damme et al. ........ 430/303 |
| 6,210,857 B1 | * | 4/2001 | Vermeersch et al. .... 430/270.1 |
| 6,214,515 B1 | * | 4/2001 | Van Damm et al. ..... 430/188 |
| 6,218,083 B1 | * | 4/2001 | McCullough et al. .... 430/326 |
| 6,232,038 B1 | | 5/2001 | Takasaki et al. ...... 430/281.1 |
| 6,245,477 B1 | * | 6/2001 | Ray et al. ........... 430/138 |
| 6,245,486 B1 | * | 6/2001 | Teng ................ 430/303 |

FOREIGN PATENT DOCUMENTS

EP 559257 A1 * 9/1993

* cited by examiner

Primary Examiner—Janet Baxter
Assistant Examiner—Barbara Gilmore

(57) ABSTRACT

A lithographic printing plate comprises on a substrate a thermo-deactivatable photosensitive layer that is photohardenable before exposure to an infrared radiation and can be rendered incapable or having reduced rate of photohardening upon exposure to an infrared radiation. Optionally, an oleophobic top layer may be deposited on the photosensitive layer to form a waterless plate. Such a plate can be imagewise exposed with an infrared laser to thermally deactivate the photosensitive layer in the exposed areas, followed by overall actinic light exposure to harden the infrared laser non-exposed areas. The exposed plate can be developed with a suitable developer to remove the infrared laser exposed areas. A plate with an ink and/or fountain solution soluble or dispersible photosensitive layer of this invention can be developed on a printing press with ink and/or fountain solution during initial press operation.

34 Claims, No Drawings

LITHOGRAPHIC PRINTING PLATES HAVING A THERMO-DEACTIVATABLE PHOTOSENSITIVE LAYER

FIELD OF THE INVENTION

This invention relates to lithographic printing plates. More particularly, it relates to lithographic plates capable of direct imaging using digitally controlled laser output. More specifically, it relates to lithographic plates comprising on a substrate a thermo-deactivatable photosensitive layer, and methods of processing such lithographic plates.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

Lithographic printing can be further divided into two general types: wet lithographic printing (conventional lithographic printing) and waterless lithographic printing. In wet lithographic printing plates, the ink-receptive areas consist of oleophilic materials and the ink-repelling areas consist of hydrophilic materials; fountain solution (consisting of primarily water) is required to continuously dampen the hydrophilic materials during printing operation to make the non-image areas oleophobic (ink-repelling). In waterless lithographic printing plates, the ink-receptive areas consist of oleophilic materials and the ink-repelling areas consist of oleophobic materials; no dampening with fountain solution is required.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties (such as hydrophilic vs. oleophilic, and oleophobic vs. oleophilic). The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, and 6,071,675.

Conventionally, the plate is exposed with an actinic light (usually an ultraviolet light from a lamp) through a separate photomask film having predetermined image pattern which is placed between the light source and the plate. While capable of providing plate with superior lithographic quality, such a method is cumbersome and labor intensive.

Laser sources have been increasingly used to imagewise expose a printing plate that is sensitized to a corresponding laser wavelength. This allows the elimination of the photomask film, reducing material, equipment and labor cost.

Among the laser imagable plates, infrared laser sensitive plates are the most attractive because they can be handled and processed under white light. Infrared laser sensitive plates are also called thermosensitive plates or thermal plates because the infrared laser is generally converted to heat to cause a certain chemical or physical change (such as hardening, solubilization, ablation, phase change, or thermal flow) needed for imaging formation on a plate. Various thermosensitive plates have been disclosed in the patent literature. Examples of thermosensitive plates are described below.

U.S. Pat. No. 5,379,698 describes a lithographic plate comprising a top polymer layer, a thin metal layer, and a substrate. The top polymer layer and the substrate have opposite affinity to ink. The plate is imaged by exposing with an infrared laser to thermally ablate the thin metal layer and the top polymer layer, baring the substrate in the exposed areas. While this plate can eliminate the use of photomask, it has the disadvantage of producing hazardous ablation debris during laser exposure, and often requires a cleaning step after exposure.

U.S. Pat. No. 5,705,309 describes a lithographic plate having on a substrate a thermosensitive layer comprising a photocrosslinkable polymeric binder having pendant ethylenic groups, a polyazide photoinitiator, and an infrared absorbing compound. This plate can be exposed with an infrared laser and then developed with a liquid developer to form a negative plate. While this plate allows digital imaging without the use of photomask, it requires a cumbersome liquid development process and has limited press run length.

U.S. Pat. No. 5,491,046 describes a lithograghic plate having on a substrate a photosensitive layer comprising a resole resin, a novolac resin, a haloalkyl substituted s-triazine, and an infrared absorber. This plate is sensitive to ultraviolet and infrared radiation and capable of functioning in either a positive-working or negative working manner. The plate can be imagewise exposed with an infrared laser followed by development to form a positive plate, or can be imagewise exposed with an infrared laser and then baked at an elevated temperature followed by development to form a negative plate. While this plate is capable of digital imaging and can act as both positive and negative plate, it requires a cumbersome baking process to achieve high press run length.

U.S. Pat. No. 4,132,168 describes a lithographic plate consisting of on a substrate an ultraviolet light (UV) sensitive layer and a top mask layer that is opaque to UV light and is capable of being removed or rendered transparent to UV light by a non-actinic laser radiation. While this plate is capable of digital imaging, it requires two cumbersome chemical processes after exposure, namely a mask layer removal process and a development process.

U.S. Pat. Nos. 5,674,658 and 5,677,106 describe a lithographic printing plate having on a porous hydrophilic substrate an oleophilic imaging layer. The imaging layer comprises a polymeric binder and an infrared absorbing dye, and is capable of bonding to the porous substrate surface through thermal flow upon exposure to a radiation. The non-exposed areas are capable of removal from the substrate by contacting with ink or by peeling. While this plate is useful, it suffers from poor press durability because the image layer in the exposed areas is not hardened (crosslinked) and can be quickly washed off during press operation.

U.S. Pat. No. 6,117,610 describes a lithographic printing plate having an imaging layer comprising a non-basic infrared radiation absorbing material and a phenolic resin that is either mixed or reacted with an o-diazonaphthoquinone derivative. The plate can be imagewise exposed with an infrared laser, followed by development with an aqueous developer, to remove the imagewise exposed areas of the image layer to form a positive plate. Alternatively, the plate can be imagewise exposed with an infrared laser and then overall exposed with an actinic radiation, followed by development with an aqueous developer, to remove the non-imagewise exposed areas of the image layer to form a negative plate. While this plate allows direct digital imaging, it has limited press run length because the imaging layer in the imaging areas is not fully crosslinked.

U.S. Pat. No. 5,919,600 describes an infrared laser imagable waterless lithographic printing plate having on a substrate a thermal imaging layer and a crosslinked silicone polymer top layer. The thermal imaging layer contains an allyl functional polyurethane mixed with an infrared absorbing dye or pigment. The imaging layer becomes more soluble upon exposure to an infrared radiation. The plate can be developed by mild brushing or rubbing with a developing solvent to selectively remove the laser-struck portions of the thermal imaging layer. While this plate allows direct digital imaging, it has limited press run length because the imaging layer in the imaging areas is not fully crosslinked and it requires a cumbersome solvent development process.

Despite the progress in digital laser imagable plates, there is a desire for a lithographic plate (wet or waterless plate) which can be imaged by infrared laser, does not produce ablation debris, does not require a baking process, and has excellent press durability. There is also a desire for a digital laser imagable lithographic plate that does not require a separate liquid development process.

SUMMARY OF THE INVENTION

It is an object of this invention to provide an infrared radiation imagable lithographic plate which can be exposed digitally with an infrared radiation (followed by overall actinic exposure) and has excellent press run length.

It is another object of this invention to provide a lithographic plate comprising on a substrate a thermo-deactivatable photosensitive layer, with or without a top oleophobic polymer layer; and a method of imaging such a plate by imagewise exposure with an infrared laser to deactivate the photosensitive layer in the infrared laser exposed areas, followed by overall actinic light exposure to selectively harden the infrared laser non-exposed areas.

It is another object of this invention to provide a method of on-press developing an infrared radiation imagable lithographic plate with ink and/or fountain solution.

It is another object of this invention to provide a method of exposing and on-press developing an infrared radiation imagable lithographic plate with the plate being mounted on the plate cylinder of a lithographic press.

It is another object of this invention to provide a lithographic plate capable of both digital exposure with an infrared laser (followed by overall actinic exposure) and conventional exposure with an ultraviolet light through a photomask.

Further objects, features and advantages of the present invention will become apparent from the detailed description of the preferred embodiments.

According to the present invention, there has been provided a lithographic printing plate comprising on a substrate a thermo-deactivatable photosensitive layer, said photosensitive layer being photohardenable before exposure to an infrared radiation and being capable of becoming non-photohardenable or having reduced rate of photohardening in the exposed areas upon exposure to an infrared radiation, wherein said photosensitive layer exhibits an affinity or aversion substantially opposite to the affinity or aversion of said substrate to at least one printing liquid selected from the group consisting of ink and an abhesive fluid for ink. The term photohardenable in this patent means capable of hardening upon exposure to an actinic radiation.

According to another aspect of the present invention, there has been provided a method of processing a lithographic printing plate, comprising in order: (a) providing a lithographic plate as described above; (b) imagewise exposing the plate with the infrared radiation to render the photosensitive layer incapable or having reduced rate of photohardening in the exposed areas; (c) overall exposing the plate with an actinic radiation at a suitable dosage to cause hardening of the photosensitive layer in the infrared radiation non-exposed areas and not in the infrared radiation exposed areas; and (d) developing the plate to remove the photosensitive layer in the infrared radiation exposed areas and not in the infrared radiation non-exposed areas.

For the above process, a plate having a photosensitive layer soluble or dispersible in ink (for waterless plate) or in ink and/or fountain solution (for wet plate) can also be developed on a lithographic press with ink and/or fountain solution. Also, the imagewise infrared laser exposure, overall actinic light exposure, and on-press development with ink and/or fountain solution can be carried out with the plate being mounted on the same plate cylinder of a lithographic press.

According to another aspect of the present invention, there has been provided a lithographic printing plate comprising on an oleophilic substrate a thermo-deactivatable photosensitive layer and an oleophobic polymer top layer, wherein said photosensitive layer is photohardenable before exposure to an infrared radiation and is capable of being rendered non-photohardenable or having reduced rate of photohardening in the exposed areas upon exposure to an infrared radiation.

According to another aspect of the present invention, there has been provided a method of processing a lithographic printing plate, comprising in order: (a) providing a lithographic plate as described above (with a top oleophobic polymer layer); (b) imagewise exposing the plate with the infrared radiation to render the photosensitive layer incapable or having reduced rate of photohardening in the exposed areas; (c) overall exposing the plate with an actinic radiation at a suitable dosage to cause hardening of the photosensitive layer in the infrared radiation non-exposed areas and not in the infrared radiation exposed areas; and (d) developing the plate to remove the photosensitive layer and the top oleophobic layer in the infrared radiation exposed areas and not in the infrared radiation non-exposed areas. Optionally, the oleophobic layer in the infrared radiation exposed areas can be removed by a physical means, such as rubbing with a cloth, after the actinic light overall exposure and before development.

For the above process, a plate having a photosensitive layer soluble or dispersible in ink can also be developed on a lithographic press with ink. Also, the imagewise infrared laser exposure, overall actinic light exposure, and on-press development with ink can be carried out with the plate being mounted on the same plate cylinder of a press.

It is important that the thermal exposure with an infrared laser does not cause hardening of the photosensitive layer. Indeed, I have found surprisingly that, many photosensitive free radical polymerizable layers with addition of an infrared absorber can be rendered incapable or having reduced rate of photohardening without causing hardening upon thermal exposure to an infrared laser.

In addition to digital thermal exposure with an infrared radiation (followed by overall actinic radiation), such plates can also be conventionally exposed with an actinic light through a photomask to harden the actinic light exposed areas.

DETAILED DESCRIPTION OF THE PREFERRED EMBODIMENTS

The substrate employed in the lithographic plates of this invention can be any lithographic support. Such a substrate may be a metal sheet, a polymer film, or a coated paper. Aluminum (including aluminum alloys) sheet is a preferred metal support. Particularly preferred is an aluminum support that has been grained, anodized, and deposited with a barrier layer. Polyester film is a preferred polymeric film support. A surface coating may be coated to achieve desired surface properties. For wet plates, the substrate should have a hydrophilic or oleophilic surface, depending on the surface properties of the photosensitive layer; commonly, a wet lithographic plate has a hydrophilic substrate and an oleophilic photosensitive layer. For waterless plates, the substrate should have an oleophilic or oleophobic surface, depending on the surface properties of the top layer.

Particularly preferred hydrophilic substrate for a wet lithographic plate is an aluminum support that has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

For preparing the thermo-deactivatable photosensitive layer of the lithographic printing plates of the current invention, any radiation-sensitive material is suitable which is capable of hardening upon exposure to an actinic radiation (from 150 to 700 nm in wavelength) and is also capable of being, fully or partially, thermally deactivated for photohardening capability upon exposure to an infrared radiation (above 700 nm in wavelength). The infrared radiation will, fully or partially, thermally deactivate the photohardening capability of the photosensitive layer, but will not cause hardening of the photosensitive layer. While full deactivation renders the photosensitive layer incapable of photohardening, partial deactivation renders the photosensitive layer having reduced rate of photohardening (needing more actinic light exposure dosage to become hardened). In this patent, hardening means becoming insoluble in a suitable developer. Photohardening means becoming insoluble in a suitable developer by exposing to an actinic radiation. For on-press developable plate of this invention, the developer can be ink and/or fountain solution. Hardening can be achieved through crosslinking or polymerization of a polymerizable resin (monomer, oligomer, or polymer), or through insolubilizing chemical change on a resin (such as loss of carboxylic acid groups for alkaline soluble polymer or compound). For free radical or cationic polymerizable photosensitive layer, the hardening is achieved through crosslinking or polymerization of a polymerizable resin. An infrared absorbing dye or pigment is usually used in the photosensitive layer to convert radiation to heat. Coating methods for applying a photosensitive layer on a plate substrate are well known in the art. Examples of suitable coating methods in this invention include roller coating, slit coating, curtain coating, dip coating, and the like. The photosensitive layer preferably has a coverage of from 0.1 to 5 $g/m^2$, and more preferably from 0.3 to 2 $g/m^2$.

The plate can be imagewise exposed with an infrared radiation to fully or partially deactivate the photohardening capability of the photosensitive layer in the exposed areas, followed by overall exposure with an actinic radiation at a suitable dosage to selectively harden the infrared laser non-exposed areas. The infrared radiation is transferred to heat upon absorption by the photosensitive layer and the heat causes chemical and/or physical changes to deactivate the photosensitive layer. Such an exposure with infrared radiation to produce heat is also called thermal exposure in this patent. In the event that the infrared radiation fully deactivates the photohardening capability of the photosensitive layer, the plate can be exposed with an actinic radiation at any dosage sufficient to harden the infrared laser non-exposed areas; the actinic radiation will not cause hardening of the infrared radiation exposed areas even at very high dosage. In the event that the infrared radiation partially deactivates the photohardening capability of the photosensitive layer, the plate should be exposed with an actinic radiation at a dosage sufficient to harden the infrared radiation non-exposed areas but not high enough to harden the infrared radiation exposed areas; over-exposure with an actinic radiation will cause hardening in both infrared radiation exposed and non-exposed areas.

The thermal deactivation of the photohardening capability of the photosensitive layer can be achieved through any means. Such means include, for example, thermal decomposition of the photosensitive initiator or a compound in a photoinitiating system, thermal generation of a compound which inhibits the photoinitiating system, thermal generation of a compound which has significantly increased actinic light absorbency, and thermal evaporation of a compound of an initiating system. The photoinitiating system can be a single compound (such as initiator), two compounds (such as initiator and co-initiator, or initiator and sensitizer), or more compounds (such as initiator, co-initiator and sensitizer); each compound plays either an essential role (required for photoinitiation) or enhancing role (significantly improving the photoinitiating efficiency or photospeed). The thermo-deactivation of the photosensitive layer of a plate may be achieved through one or more mechanisms and/or processes. Although it is generally preferred that the thermal exposure of the photosensitive layer does not generate debris through ablation, photosensitive layer capable of partial ablation at normal exposure dosage can also be used for the applications of this invention; a debris collecting device (usually a vacuum filter) may be used to collect the debris generated during the thermal exposure. The thermo-deactivatable photosensitive layer suitable for the current invention may be formulated from various photohardenable photosensitive materials with addition of an infrared light absorber. For certain photosensitive materials, a compound capable of thermally generating a new compound that fully or partially deactivates the photohardening capability of the photosensitive layer can be added. It is important that the photohardenable photosensitive materials remain non-hardened after thermal exposure with an infrared laser. Various additives, such as surfactant, plasticizer, pigment, dye, exposure indicator and stabilizer, may be added to enhance the performance of the plates. A visible dye or pigment capable of being thermally bleached upon exposure to an infrared radiation may be added to the photosensitive layer to provide, for example, visible imaging pattern. The bleaching of such a visible dye or pigment in the thermally exposed areas also allows reduced color contamination to the developer or, for on-press developable plates of this invention, to the ink and/or fountain solution.

In a preferred embodiment of the invention, the thermo-deactivatable photosensitive layer comprises a free radical polymerizable monomer or oligomer, a thermal deactivatable photosensitive free radical initiating system consisting of one or more compounds, and an infrared light absorber. A polymeric binder (with or without ethylenic functionality) can also be added. Here, the thermo-deactivatable photosensitive free radical initiating system can be (1) a photosensitive free radical initiating system having two or more compounds with at least one of the compounds being thermally decomposable (including a thermally decomposable photosensitive free radical initiator), (2) a photosensitive free radical initiating system capable of actinically generating α-aminoalkyl radicals and a thermal acid generator, (3) a photosensitive free radical initiating system and a compound capable of thermally generating a free radical inhibitor, (4) a photosensitive free radical initiating system and a compound or system capable of generating a new compound having substantially increased absorbency to an actinic light upon thermal exposure to an infrared laser, or (5) a photosensitive free radical initiating system having one or more compounds with at least one of them being capable of fast thermal evaporation (with or without partial ablation of the photosensitive layer). Clearly, photosensitive layer may also have a combination of more than one thermo-deactivation systems and/or processes. Also, multiple initiators or initiating systems may be used instead of one to achieve certain synergetic effects. Some compound may be able to play more than one role. For example, some infrared light absorbing dye can produce Bronsted acid upon decomposition, and can be used as both thermal acid generator (as needed) and infrared radiation absorber in the photosensitive layer of this invention. A photosensitive free radical initiating system may consist of a single compound (such as initiator), two compounds (such as initiator and co-initiator, or initiator and sensitizer), or more compounds (such as initiator, co-initiator and sensitizer). For photosensitive initiating system having two or more compounds of this invention, the deactivation (through, for example, decomposition, evaporation, or inhibition) of any one of these compounds will render the initiating system incapable or having reduced efficiency (such as reduced rate) of photoinitiation. A preferred thermo-deactivatable free radical crosslinkable photosensitive layer comprises a polymeric binder (with or without ethylenic functionality), a free radical polymerizable monomer or oligomer having at least one terminal ethylenic group (such as acrylic or methacrylic monomer or oligomer), a thermally deactivatable photosensitive free radical initiating system consisting of one or more compounds, and an infrared absorbing dye or pigment. Other additives such as surfactant, dye or pigment, exposure-indicating dye (such as leuco crystal violet, azobenzene, 4-phenylazodiphenylamine, and methylene blue dyes), and free-radical stabilizer (such as methoxyhydroquinone) may be added.

Suitable polymeric binders include, for example, polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehyde, and butadiene/acrylonitrile copolymer.

Suitable free-radical polymerizable monomers or oligomers include any monomers or oligomers capable of free radical polymerization. Acrylate or methacrylate monomers or oligomers are preferred free-radical polymerizable monomers or oligomers. Examples of useful acrylate or methacrylate monomers or oligomers are acrylate and methacrylate esters of ethylene glycol, trimethylolpropane, pentaerythritol, ethoxylated ethylene glycol and ethoxylated trimethylolpropane; multifunctional urethanated acrylate and methacrylate; and epoxylated acrylate and methacrylate.

Infrared absorbing materials useful in the photosensitive layer of this invention include any infrared absorbing dye or pigment. It is preferable that the dye or pigment has an absorption maximum between the wavelengths of 700 and 1,500 nm. Various infrared absorbing dyes or pigments are described in U.S. Pat. Nos. 5,858,604, 5,922,502, 6,022,668, 5,705,309, 6,017,677, 6,143,464, and 5,677,106, and can be used in the photosensitive layer of this invention. Examples of useful infrared absorbing dyes include squarylium, croconate, cyanine, phthalocyanine, merocyanine, chalcogenopyryloarylidene, oxyindolizine, quinoid, indolizine, pyrylium and metal dithiolene dyes. Examples of useful infrared absorbing pigments include black pigments, metal powder pigments, phthalocyanine pigments, and carbon black. Mixtures of dyes, pigments, or both can also be used. These dyes or pigments can be added in the photosensitive layer at from 0.2 to 40% by weight of the solid composition, preferably from 1 to 20%.

The thermal decomposable photosensitive free-radical initiator suitable for the current invention can be any photosensitive free radical initiator having a decomposition temperature of between 50 and 300° C. Here the decomposition temperature is a temperature at which the compound rapidly decomposes to two or more smaller compounds. A co-initiator or sensitizer (if needed) may be added to facilitate the free radical generation and/or the free radical initiation of polymerization upon exposure to an actinic radiation. It is important that the thermal decomposition of the photosensitive free radical initiator in this invention will not cause hardening (substantial free radical polymerization) of the free radical polymerizable monomer or oligomer. Such photosensitive free radical initiators include the derivatives of acetophenone (such as 2,2-dimethoxy-2-phenylacetophenone, and 2-methyl-1-[4-(methylthio)

phenyl]-2-morpholino propan-1-one), benzophenone, 4,4'-bis(diethylamino)benzophenone, benzil, ketocoumarin (such as 3-benzoyl-7-methoxy coumarin and 7-methoxy coumarin), 2,4,6-trimethylbenzoyldiphenylphophine oxide, xanthone, thioxanthone, benzoin or an alkyl-substituted anthraquinone, haloalkyl substituted s-triazine (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-naphth-1-yl]-s-triazine), and titanocene (bis($\eta^9$-2,4-cyclopentadien-1-yl), bis[2,6-difluoro-3-(1H-pyrrol-1-yl)phenyl) titanium).

The photosensitive free radical initiating system having two or more compounds with at least one of the compounds being thermally decomposable can be any photosensitive free radical initiating system having two or more compounds with at least one of the compounds having a decomposition temperature of between 50 and 300° C. Here each compound in the free radical initiating system plays an essential or enhancing role; the decomposition of any of the compounds will deactivate the photoinitiating capability or reduce the photo initiating efficiency of the system. Examples of such a system are initiating system consisting of benzophenone and triethylamine, and initiating system consisting of 2-methyl-1-[4-(methylthio)phenyl]-2-morpholino propan-1-one and 2-isopropyl thioxathen-9-one.

The photosensitive free radical initiating system capable of actinically generating α-aminoalkyl radicals can be a single initiator or initiating system having two or more compounds. Examples of such initiators or initiating systems are 4,4'-bis(diethylamino)benzophenone, 2-benzyl-2-N,N-dimethylamino-1-(4-morpholinophenyl)-1-butanone, initiating system consisting of benzophenone and triethylamine. The compound capable of generating α-aminoalkyl radicals can be any organoamine (including primary, secondary, and tertiary organoamines) having an alpha-hydrogen on the carbon next to the nitrogen atom. Such photosensitive free radical initiating systems can be partially or fully deactivated by chemically changing the organoamine to organoammonium salt in the presence of a Bronsted acid (such as p-toluenesulfonic acid or acetic acid). Therefore, thermal generation of a Bronsted acid will render such initiating systems partially or fully deactivated. The Bronsted acid can be generated from any thermal acid generator capable of producing free acid at elevated temperature. Various thermal acid generators have been described in the patent literature, such as U.S. Pat. Nos. 5,955,238, 6,037,098, and 6,159,655, and can be used as the thermal acid generator of the current invention. Examples of useful thermal acid generators are triarylsulfonium hexafluoroantimonate, triarylsulfonium hexafluorophosphate, diaryliodonium hexafluoroantimonate, diaryliodonium camphorsulfonate, haloalkyl substituted s-triazine, ammonium benzoate, and ammonium acetate. Many infrared absorbing dyes are capable of generating a Bronsted acid upon decomposition and can be used as the thermal acid generator as well as infrared light absorber.

Compounds capable of thermally generating free radical inhibitor include, for example, molecules or polymers capable of thermally generating a phenol group, such as molecules or polymers having a t-butyl, t-butoxycarbonyl, or ethyl vinyl ether blocked phenol group. Such molecules or compounds may also be used in combination with thermal acid generator to facilitate the thermal deblocking reaction to generate phenol groups.

Compounds capable of substantially increasing absorbency to an actinic light upon thermal exposure to an infrared laser include any compound or system having such a property. The increase in absorbency for a specific actinic wavelength can be achieved through various means, including, for example, change in absorbency and/or shift on wavelength through pH change (with thermal generation of acid or base) for certain dyes, thermal decomposition of a highly conjugated molecule to form smaller conjugated molecules with shorter wavelength in the actinic region. Some infrared absorbing dyes or pigments can thermally decompose to form ultraviolet or visible light absorbing dyes, and can be utilized for such an application.

Photosensitive free radical initiating system having one or more compounds with at least one of them being capable of fast thermal evaporation can be any compounds with such a property. Such compounds should have relatively fast evaporation rates at elevated temperature. They may be partially or substantially completely evaporated upon thermal exposure to an infrared laser. The evaporation of such compounds may or may not cause partial thermal ablation of the photosensitive layer.

The top oleophobic polymer layer may comprise any oleophobic film-forming material. Suitable oleophobic polymers include silicone rubbers and perfluorocarbon groups-containing polymers. Silicone rubbers (silicone elastomers or crosslinked polydiorganosiloxanes) are preferred polymers. The oleophobic polymer layer may optionally contain pigments and fillers such as silica, calcium carbonate, and titanium oxide. Adhesion promoters may also be added to the coating to improve silicone layer formation. Various silicone rubber layers are described in, for example, U.S. Pat. Nos. 5,919,600, 6,194,122, 5,379,689, 5,955,238, and 5,353,705, and can be used as the top oleophobic polymer layer of this invention. The silicone rubber layer may be deposited on the photosensitive layer from a solution or dispersion. The silicone may be crosslinked by baking or radiation curing; for radiation curing the radiation should be at a different wavelength from the actinic light for the photosensitive layer so that the radiation curing of the silicone will not cause hardening of the photosensitive layer. Coating methods for applying silicone coatings are known in the art. Examples of suitable coating methods in this invention include roller coating, slit coating, curtain coating, dip coating, and the like. The coating coverage of the silicone layer is preferably from 0.1 to 10 g/m², and more preferably from 0.5 to about 3.0 g/m².

The term actinic light or actinic radiation in this patent refers to radiation that can cause hardening of the photosensitive layer. The actinic radiation in this patent should be in the region from ultraviolet light to visible light (about 150 to about 700 nm in wavelength). Ultraviolet light is a preferred actinic radiation. The photosensitive layer can be actinically sensitized to a typical ultraviolet light (about 365 nm) or a visible light, or both. It can also be sensitized to a shorter ultraviolet light (such as shorter than 350 nm). The photosensitive layer can be hardened with any actinic light to which it is sensitized. Photosensitive layer sensitized to an ultraviolet light or visible light can be exposed with the ultraviolet light or visible light. Photosensitive layer sensitized to a shorter ultraviolet light (such as shorter than 370 nm, or shorter than 350 nm) but not to longer wavelength light (such as above 380 nm) has good white light stability. Each type of spectral sensitivity has its own advantage, and can be used to design a specific product. In this patent, all types of spectral sensitivity can be used.

In addition to the capability of imaging with an infrared laser to deactivate the photohardening capability of the radiation sensitive layer (followed by overall actinic exposure to harden the infrared radiation exposed areas), the lithographic plates of this invention are also capable of exposure with an actinic radiation through a photomask to harden the exposed areas. The actinic radiation can be an ultraviolet light or visible light. The plate may also be digitally exposed from an actinic light source in the ultraviolet or visible region (such as an ultraviolet or visible laser) without the use of a photomask. Because of the relatively low power of the current ultraviolet and visible lasers, the plates generally need to be sensitized to faster photospeed to be useful for direct imaging with ultraviolet or visible laser. Visible (including violet) lasers suitable for direct digital exposure include, for example, frequency-doubled Nd/YAG laser (532 nm), argon laser (488 nm), and violet laser (about 410 nm).

For on-press developable plates of this invention, various surfactants may be added into the photosensitive layer to allow or enhance the on-press ink and/or fountain solution developability. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (such as Tergitol MIM-FOAM from Union Carbide, and Pluronic L43, L64, 1107, P103 and 10 R5 from BASF); ethoxylated or propoxylated acrylate oligomers (such as polyethoxylated (20) trimethylolpropane triacrylate, polyethylene glycol (600) diacrylate, and polypropoxylated (6) trimethylolpropane triacrylate, SR415, SR610, and SR501, respectively, from Sartomer Company, Exton, Pa.); and polyethoxylated alkylphenols and polyethoxylated fatty alcohols (such as Triton X-100, Triton X-102, Triton X-165, Triton X-305, Triton X-405, Triton X-705, Triton X-45, Triton X-114, Triton CF-10, Triton CA, and Triton DF-12 from Union Carbide). The nonionic surfactant can be added at 0.2 to 30% by weight of the photosensitive layer, preferably 1 to 15%.

A particulate dispersion may be added into the photosensitive layer to enhance, for example, the developability and non-tackiness of the plate, as described in U.S. Pat. No. 6,071,675, the entire disclosure of which is hereby incorporated by reference.

For plate without a top crosslinked silicone polymer layer on the photosensitive layer, the photosensitive layer should exhibit an affinity or aversion substantially opposite to the affinity or aversion of the substrate to at least one printing liquid selected from the group consisting of ink and an abhesive fluid for ink. For example, a wet plate can-have a hydrophilic substrate and an oleophilic photosensitive layer, or can have an oleophilic substrate and a hydrophilic photosensitive layer; a waterless plate can have an oleophilic substrate and an oleophobic photosensitive layer, or can have an oleophobic substrate and an oleophilic photosensitive layer. An abhesive fluid for ink is a fluid which repels ink. Fountain solution (comprising primarily water) is the most commonly used abhesive fluid for ink. A wet plate is printed on a wet press equipped with both ink and fountain solution, while a waterless plate is printed on a waterless press equipped with ink.

The photosensitive layer may be conformally coated onto a roughened substrate (for example, with Ra of larger than 0.4 micrometer) at thin coverage (for example, of less than 1.0 g/m$^2$) so that the plate can have microscopic peaks and valleys on the photosensitive layer coated surface and exhibit low tackiness and good block resistance, as described in U.S. patent application Ser. No. 09/605018, the entire disclosure of which is hereby incorporated by reference.

For plates without a silicone top layer on the photosensitive layer, a developer soluble or dispersible protective overcoat may be deposited on the photosensitive layer to, for example, protect the photosensitive layer from oxygen inhibition, contamination and/or physical damage during handling. For plates developable with an aqueous developer, the overcoat preferably comprises a water-soluble polymer. For on-press developable plates, such an overcoat should be soluble or dispersible in ink (for waterless plate) or ink and/or fountain solution (for wet plate). Such an overcoat preferably has a coverage of from 0.001 to 2.0 g/m$^2$. A thinner overcoat (from 0.001 to 0.30 g/m$^2$) is generally preferred for on-press developable plates.

For plates with an oleophobic polymer top layer on the photosensitive layer, an oleophilic interlayer may be interposed between the substrate and the photosensitive layer to provide better ink receptivity of the exposed and developed areas, improved adhesion between the photosensitive layer and the substrate, and/or reduced heat dissipation to the substrate. This oleophilic interlayer can comprise a polymer, preferably a crosslinked polymer.

For plates with rough and/or porous surface capable of mechanical interlocking with a coating deposited thereon, a thin releasable interlayer soluble or dispersible in a suitable developer may be deposited between the substrate and the photosensitive layer. For on-press developable plates, the thin releasable interlayer should be soluble or dispersible in ink (for waterless plate) or ink and/or fountain solution (for wet plate). Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference.

Infrared lasers useful for the imagewise exposure of the plates of this invention include laser sources emitting in the infrared region, i.e. emitting in the wavelength range of above 700 nm, preferably 700–1500 nm. Particularly preferred infrared laser sources are laser diodes emitting around 830 nm or a NdYAG laser emitting around 1060 nm. The plate is exposed at a laser dosage sufficient to generate heat to thermally cause chemical or physical change needed to deactivate the photohardening capability of the photosensitive layer. For most plates of this invention, the thermal exposure does not cause thermal ablation; however, for some plates of this invention, thermal exposure may cause partial ablation of the photosensitive layer. The infrared exposure dosage is preferably about 10 to about 3000 mJ/cm$^2$, and more preferably about 40 to about 1000 mJ/cm$^2$, depending on the requirement of the photosensitive layer.

Infrared laser imaging devices are currently widely available commercially. Any device can be used which provides imagewise infrared laser exposure according to digital image information. Commonly used imaging devices include flatbed imager, internal drum imager, and external drum imager. Internal drum imager and external drum imager are preferred imaging devices.

After imagewise laser exposure, the plate is subjected to an actinic light overall exposure. The actinic light can be an ultraviolet light or visible light. Examples of actinic light sources include a high pressure mercury lamp, a xenon lamp, and a fluorescence lamp. The plate can be exposed with an actinic light in a regular plate exposure device with or without the plate being under vacuum, or can be directly exposed on the same imaging device for the infrared laser exposure with the plate being on an imaging drum or flatbed. When a plate is overall exposed on an imaging drum, the imaging drum can be in a stationary position or can be rotating, depending on the design of the actinic exposure device. For on-press developable plates, the plate may also be exposed on a printing press cylinder (for both laser imaging and overall actinic radiation), and the exposed plate can be directly developed on press with ink and/or fountain solution and then print out regular printed sheets.

For on-press developable plates of this invention, the imagewise and overall exposed plate can be on-press developed with ink (for waterless plate) or with ink and/or fountain solution (for wet plate). The plate is mounted on the press cylinder of a lithographic press. The press is then started to contact the plate with ink (for waterless plate) or with ink and/or fountain solution (for wet plate) to develop the photosensitive layer, and to lithographically print images from said plate to the receiving medium. Good quality prints should be obtained preferably under 20 initial impressions, more preferably under 10 impressions, most preferably under 5 impressions. It is noted that the receiving medium can be any object onto which images can be printed lithographically. Commonly, the receiving medium is sheet-like material or web-like material, such as paper, plastic film, or metal foil. Sheet-like materials (such as paper sheets) are suitable for printing on a sheet-fed press, and web-like materials (such as a roll of paper) are suitable for printing on a web-fed press.

For wet press with conventional dampening system, usually fountain solution is applied (to contact the plate) first, followed by contacting with ink roller. For wet press with integrated inking system, the ink and fountain solution are emulsified by the various press rollers before being transferred to the plate as emulsion of ink and fountain solution. However, in this invention, the ink and fountain solution may be applied at any combination or sequence, as needed for the plate. There is no particular limitation. The recently introduced single fluid ink by Flink Ink Company, which can be used for printing wet lithographic plate without the use of fountain solution, can also be used for the on-press development and printing of the plate of this invention.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which usually comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol may also be added in the fountain solution. Water is the simplest type of fountain solution. Fountain solution is usually mildly acidic or neutral. However, for certain plates, mildly basic fountain solution may be used. The type of fountain solution used depends on the type of the plate substrate as well as the plate. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

Optionally, for wet lithographic plate, the plate may be applied with an aqueous solution, including water and fountain solution, to dampen the plate, before on-press development with ink and/or fountain solution.

This invention is further illustrated by the following examples of its practice. Unless specified, all the values are by weight.

EXAMPLE 1

An electrochemically grained, anodized, and silicate treated aluminum sheet (with an average roughness Ra of about 0.5 microns) was coated using a #6 Meyer rod with a thermo-deactivatable photosensitive layer formulation TPS-1 to achieve a dry coverage of about 1.0 g/m$^2$, followed by drying in an oven at 70° C. for 8 min.

| TPS-1 | |
|---|---|
| Component | Weight (g) |
| Neocryl B-728 (Polymer from Zeneca Resins) | 2.480 |
| Sartomer SR-399 (Acrylic monomer from Sartomer Company) | 5.926 |
| Pluronic L43 (Surfactant from BASF Corporation) | 0.504 |
| Leuco crystal violet (Exposure indicator) | 0.202 |
| 2,6-Di-tert-butyl-4-methylphenol (BHT, Antioxidant) | 0.021 |
| Irganox 1035 (Antioxidant from Ciba-Geigy) | 0.021 |
| 2,4-bis(trichloromethyl)-6-(4-methoxy-naphth-1-yl)-s-triazine (Initiator) | 0.395 |
| PINA KF1026 (Infrared absorbing dye from Allied Signals) | 0.501 |
| Acetone | 89.950 |

The above plate was exposed with an infrared laser plate imager equipped with laser diodes (32-beams, about 500 mW each) emitting at about 830 nm (Trendsetter plate imager from CreoScitex). The plate was placed on the imaging drum (external drum) and secured with clamps and vacuum. The exposure dosage was controlled by the drum speed. The plate was exposed at a laser dosage of about 400 mJ/cm². The exposed areas showed purple blue color, and no ablation was observed. The laser-imaged plate was overall exposed to a UV light with an emission peak of about 364 nm for 2 min.

The exposed plate was cut into two smaller plates. The first plate was developed conventionally by wiping with a cloth dampened with 91% isopropyl alcohol (having 9% water), followed by rinse with tap water. The infrared laser exposed areas were removed and the infrared laser non-exposed areas remained on the plate. The developed plate was inked up by wiping with a cloth dampened with both ink and fountain solution. The infrared laser non-exposed areas accepted ink and the infrared laser exposed areas repelled ink, indicating good inking and clean background.

The second plate was subjected to hand test for on-press development. The plate was rubbed 10 times with a cloth soaked with both fountain solution and ink to check on-press development and inking; additional 200 rubs were performed to check the durability of the plate. Here a rub is defined as a back-and-forth rub. The plate developed completely under 6 rubs, with the laser-exposed areas of the photosensitive layer being completely removed. The plate showed good inked imaging pattern, clean background, and good durability (no wearing off at 200 rubs).

EXAMPLE 2

In this example, the plate was exposed at a higher infrared laser dosage to cause partial thermal ablation. The same plate as prepared in EXAMPLE 1 was exposed with an infrared laser at a dosage of about 700 mJ/cm², using the same plate imager as described in EXAMPLE 1. The exposed areas showed purple blue color and partial thermal ablation. The laser-imaged plate was overall exposed to a UV light with an emission peak of about 364 nm for 2 min.

The exposed plate was hand developed with 91% isopropyl alcohol as in EXAMPLE 1. The infrared laser exposed areas were removed and the infrared laser non-exposed areas remained on the plate. The developed plate was inked up by wiping with a cloth dampened with both ink and fountain solution. The infrared laser non-exposed areas accepted ink and the infrared laser exposed areas repelled ink, indicating good inking and clean background.

EXAMPLE 3

In this example, the plate is the same as in EXAMPLE 1 except that a thin releasable interlayer is interposed between the substrate and the thermo-deactivatable photosensitive layer.

An electrochemically grained, anodized, and silicate treated aluminum sheet was first coated with a 0.1% aqueous solution of polyvinyl alcohol (Airvol 540, from Air Products and Chemicals) with a #6 Meyer rod, followed by drying in an oven at 100° C. for 5 min. The polyvinyl alcohol coated substrate was further coated with the photosensitive layer formulation TPS-1 with a #6 Meyer rod, followed by drying in an oven at 70° C. for 8 min.

The plate was imagewise and overall exposed, and then developed with ink and fountain solution as in EXAMPLE 1. The plate developed completely under 4 rubs with ink and fountain solution, and showed good inked imaging pattern, clean background and good durability.

EXAMPLE 4

This example demonstrates a plate having an overcoat on the photosensitive layer. The plate prepared in EXAMPLE 1 was further coated with a water-soluble overcoat OC-1 with a #6 Meyer rod, followed by drying in an oven at 70° C. for 8 min.

| OC-1 | |
|---|---|
| Component | Weight ratios |
| Airvol 205 (Polyvinyl alcohol from Air Products and Chemicals) | 0.190 |
| Aerosol-OT (Surfactant from Cytec Industries Inc.) | 0.010 |
| Water | 99.800 |

The plate was imagewise and overall exposed, and then developed with ink and fountain solution as in EXAMPLE 1. The plate developed completely under 4 rubs with ink and fountain solution, and showed good inked imaging pattern, clean background and good durability.

EXAMPLE 5

This example demonstrates a lithographic printing plate having a thermo-deactivatable photosensitive layer comprising a thermal acid generator, an infrared absorber, and a free radical initiator capable of actinically generating α-aminoalkyl radicals. An electrochemically roughened, anodized, and polyvinyl phosphonic acid treated aluminum sheet was coated with thermo-deactivatable photopolymer formulation TPS-2 with a #6 Meyer rod, followed by drying in an oven at 70° C. for 8 min. The photoinitiator Irgacure 369 (from Ciba-Geigy) is 2-benzyl-2-N,N-dimethylamino-1-(4-morpholinophenyl)-1-butanone which is capable of actinically generating an α-aminoalkyl radical.

| TPS-2 | |
|---|---|
| Component | Weight (g) |
| Neocryl B-728 (Polymer from Zeneca Resins) | 2.332 |
| Sartomer SR-399 (Acrylic monomer from Sartomer Company) | 5.573 |
| Pluronic L43 (Surfactant from BASF Corporation) | 0.474 |
| Leuco crystal violet (Exposure indicator) | 0.190 |
| 2,6-Di-tert-butyl-4-methylphenol (BHT, Antioxidant) | 0.020 |
| Irganox 1035 (Antioxidant from Ciba-Geigy) | 0.020 |
| Irgacure 369 (Free radical initiator from Ciba-Geigy) | 0.395 |
| CD-1012 (Thermal acid generator from Sartomer Company) | 0.498 |
| IR-140 (Infrared absorbing dye from Eastman Kodak) | 0.499 |
| 2-Butanone | 90.000 |

The above plate was exposed with an infrared laser plate imager as described in EXAMPLE 1 at a dosage of about 250 mJ/cm². The exposed areas showed purple blue color, and no ablation was observed. The laser-imaged plate was overall exposed to a UV light with an emission peak of about 364 nm for 2 min.

The exposed plate was cut into two smaller plates. One plate was developed with 91% isopropyl alcohol and the other with ink and fountain solution, using the same procedures as in EXAMPLE 1. Both plates developed well either with 91% isopropyl alcohol or with ink and fountain solution, indicating capability of both conventional and on-press developments. The plates were further tested for inking and durability as in EXAMPLE 1. Good inked imaging pattern, clean background, and good durability were observed.

EXAMPLE 6

This example demonstrates a plate having on a roughened substrate a thin releasable interlayer, a thermo-deactivatable photosensitive layer as described in EXAMPLE 5, and a top water-soluble overcoat.

An electrochemically grained, anodized, and polyvinyl phosphonic acid treated aluminum sheet was coated sequentially with a 0.1% aqueous solution of polyvinyl alcohol (Airvol 540), a photosensitive layer formulation TPS-2, and an overcoat OC-2. Each layer was coated with a #6 Meyer rod, followed by drying in an oven at 80° C. for 5 min.

| OC-2 | |
|---|---|
| Component | Weight ratios |
| Airvol 205 (Polyvinyl alcohol from Air Products and Chemicals) | 2.0 |
| Fluorad FC-120 (Perfluorinated surfactant from 3M) | 0.02 |
| Water | 98.0 |

The above plate was exposed with an infrared laser plate imager as described in EXAMPLE 1 at a dosage of about 250 mJ/cm$^2$. The exposed areas showed purple blue color, and no ablation was observed. The laser imaged plate was overall exposed to a UV light with an emission peak of about 364 nm for 2 min.

The exposed plate was developed with ink and fountain solution as in EXAMPLE 1. The plate developed completely under 4 rubs with a cloth dampened with ink and fountain solution. The plate showed good inked imaging pattern, clean background, and good durability.

I claim:

1. A method of processing a lithographic printing plate, comprising in order:
   (a) providing a lithographic printing plate comprising on a substrate a thermo-deactivatable photosensitive layer, said photosensitive layer being photohardenable before exposure to an infrared radiation and being capable of becoming non-photohardenable or having reduced rate of photohardening in the exposed areas upon exposure to an infrared radiation, wherein said photosensitive layer exhibits an affinity or aversion substantially opposite to the affinity or aversion of said substrate to at least one printing liquid selected from the group consisting of ink and an abhesive fluid for ink;
   (b) imagewise exposing the plate with the infrared radiation to render the photosensitive layer incapable or having reduced rate of photohardening, without causing hardening of the photosensitive layer, in the exposed areas;
   (c) overall exposing the plate with an actinic radiation at a suitable dosage to cause hardening of the photosensitive layer in the infrared radiation non-exposed areas and not in the infrared radiation exposed areas; and
   (d) developing the plate to remove the photosensitive layer in the infrared radiation exposed areas and not in the infrared radiation non-exposed areas.

2. The method of claim 1 wherein said photosensitive layer comprises a monomer or oligomer with at least one acrylate or methacrylate functional group; an infrared absorbing dye or pigment; and a thermo-deactivatable photosensitive free radical initiating system selected from the group consisting of (a) a photosensitive free radical initiating system consisting of one or more compounds with at least one of the compounds being capable of fast thermal decomposition or evaporation at an elevated temperature between 50 and 300° C., and (b) a combination of a photosensitive free radical initiating system, and a compound capable of thermally generating a new compound at an elevated temperature between 50 and 300° C., said new compound being capable of fully or partially deactivating the photoinitiation capability of the photosensitive free radical initiating system.

3. The method of claim 2 wherein said thermo-deactivatable photosensitive free radical initiating system is a photosensitive free radical initiating system having one or more compounds with at least one of the compounds having a thermal decomposition temperature of between 50 and 300° C.

4. The method of claim 2 wherein said thermo-deactivatable photosensitive free radical initiating system is a photosensitive free radical initiating system having one or more compounds with at least one of the compounds having a boiling point of between 50 and 300° C.

5. The method of claim 2 wherein said thermo-deactivatable photosensitive free radical initiating system consists of a photosensitive free radical initiating system capable of actinically generating an α-aminoalkyl radical, and a compound capable of thermally generating a Bronsted acid at an elevated temperature between 50 and 300° C.

6. The method of claim 2 wherein said thermo-deactivatable photosensitive free radical initiating system consists of a photosensitive free radical initiating system and a compound capable of thermally generating a free radical inhibitor at an elevated temperature between 50 and 300° C.

7. The method of claim 2 wherein said thermo-deactivatable photosensitive free radical initiating system consists of a photosensitive free radical initiating system, and an actinic light absorbing dye precursor capable of thermally generating an actinic light absorbing dye at an elevated temperature between 50 and 300° C.

8. The method of claim 2 wherein said photosensitive layer further includes a polymeric binder.

9. The method of claim 1 wherein said infrared laser exposure does not cause thermal ablation of the photosensitive layer.

10. The method of claim 1 wherein said infrared laser exposure causes partial thermal ablation of the photosensitive layer.

11. The method of claim 1 wherein said actinic radiation is an ultraviolet light.

12. The method of claim 1 wherein said substrate is hydrophilic and said photosensitive layer is oleophilic, and said plate is a wet lithographic plate.

13. The method of claim 1 wherein said substrate is oleophilic and said photosensitive layer is oleophobic, and said plate is a waterless lithographic plate.

14. The method of claim 1 wherein said substrate is hydrophilic and said photosensitive layer is oleophilic, and said plate further includes a top water soluble or dispersible polymer layer on the photosensitive layer.

15. The method of claim 1 wherein said plate further includes a water soluble or dispersible interlayer interposed between the substrate and the photosensitive layer; wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the photosensitive layer and the substrate through mechanical interlocking.

16. The method of claim 1 wherein said substrate has a roughened surface comprising peaks and valleys, and said photosensitive layer is substantially conformally coated on the roughened substrate surface so that the surface of said photosensitive layer has peaks and valleys substantially corresponding to the major peaks and valleys of the substrate microscopic surface; and said substrate has an average surface roughness Ra of about 0.2 to about 2.0 microns, said photosensitive layer has an average coverage of about 0.1 to about 2.0 g/m², and the average height of the valleys on the photosensitive layer surface is at least 0.1 microns below the average height of the peaks of photosensitive layer surface.

17. The method of claim 1 wherein said photosensitive layer is soluble or dispersible in ink (for waterless plate) or in ink and/or fountain solution (for wet plate), and said plate is developed on a lithographic printing press by contacting with ink and/or fountain solution during the initial press operation.

18. The method of claim 1 wherein said substrate is hydrophilic; said photosensitive layer is oleophilic, is soluble or dispersible in ink and/or fountain solution, and comprises a polymeric binder, a monomer or oligomer with at least one acrylate or methacrylate functional group, an infrared absorbing dye or pigment, and a thermo-deactivatable photosensitive free radical initialing system capable of fast deactivation of photoinitiation capability at an elevated temperature between 50 and 300° C.; and said plate is developed on a wet lithographic printing press by contacting with ink and fountain solution during the initial press operation.

19. The method of claim 1 wherein said photosensitive layer is soluble or dispersible in ink (for waterless plate) or in ink and/or fountain solution (for wet plate) and said plate is developed on a lithographic printing press by contacting with ink and/or fountain solution during the initial press operation; and said imagewise infrared laser exposure, overall actinic light exposure, and on-press development are all carried out with the plate being mounted on the same plate cylinder of the press.

20. A method of processing a lithographic printing plate, comprising in order:
(a) providing a lithographic plate comprising on an oleophilic substrate a thermo-deactivatable photosensitive layer and an oleophobic polymer top layer; wherein said photosensitive layer is photohardenable before exposure to an infrared radiation and is capable of being rendered non-photohardenable or having reduced rate of photohardening upon exposure to an infrared radiation;
(b) imagewise exposing the plate with the infrared radiation to render the photosensitive layer incapable or having reduced rate of photohardening, without causing hardening of the photosensitive layer, in the exposed areas;
(c) overall exposing the plate with an actinic radiation at a suitable dosage to cause hardening of the photosensitive layer in the infrared radiation non-exposed areas and not in the infrared radiation exposed areas; and
(e) developing the plate to remove the photosensitive layer and the oleophobic polymer layer in the infrared radiation exposed areas and not in the infrared radiation non-exposed areas.

21. The method of claim 20 wherein said oleophobic polymer top layer is a silicone rubber layer; and said photosensitive layer comprises a monomer or oligomer with at least one acrylate or methacrylate functional group, an infrared absorbing dye or pigment, and a thermo-deactivatable photosensitive free radical initiating system selected from the group consisting of (a) a photosensitive free radical initiating system consisting of one or more compounds with at least one of the compounds being capable of fast thermal decomposition or evaporation at an elevated temperature between 50 and 300° C., and (b) a combination of a photosensitive free radical initiating system, and a compound capable of thermally generating a new compound at an elevated temperature between 50 and 300° C., said new compound being capable of fully or partially deactivating the photoinitiation capability of the photosensitive free radical initiating system.

22. The method of claim 20 further including a physical cleaning process to remove the oleophobic top layer in the infrared laser exposed areas after overall actinic light exposure and before development.

23. The method of claim 20 wherein said photosensitive layer is soluble or dispersible in ink, and said plate is developed on a lithographic printing press by contacting with ink during the initial press operation.

24. The method of claim 20 wherein said photosensitive layer is soluble or dispersible in ink and said plate is developed on a lithographic printing press by contacting with ink during the initial press operation; and said imagewise infrared laser exposure, overall actinic light exposure, and on-press development are all carried out with the plate being mounted on the same plate cylinder of the press.

25. A method of lithographically printing images on a receiving medium, comprising in order:
(a) providing a lithographic printing plate comprising on a substrate a thermo-deactivatable photosensitive layer, said photosensitive layer being photohardenable before exposure to an infrared radiation and being capable of becoming non-photohardenable or having reduced rate of photohardening in the exposed areas upon exposure to an infrared radiation; wherein said photosensitive layer is soluble or dispersible in ink (for waterless plate) or in ink and/or fountain solution (for wet plate), and exhibits an affinity or aversion substantially opposite to the affinity or aversion of said substrate to at least one printing liquid selected from the group consisting of ink and an abhesive fluid for ink;
(b) imagewise exposing the plate with the infrared radiation to render the photosensitive layer incapable or having reduced rate of photohardening, without causing hardening of the photosensitive layer, in the exposed areas;
(c) overall exposing the plate with an actinic radiation at a suitable dosage to cause hardening of the photosensitive layer in the infrared radiation non-exposed areas and not in the infrared radiation exposed areas; and
(d) contacting said exposed plate with ink and/or fountain solution on a lithographic press to remove the photosensitive layer in the infrared radiation exposed areas, and to lithographically print images from said plate to the receiving medium.

26. The method of claim 25 wherein said photosensitive layer comprises a monomer or oligomer with at least one acrylate or methacrylate functional group; an infrared absorbing dye or pigment; and a thermo-deactivatable photosensitive free radical initiating system selected from the group consisting of (a) a photosensitive free radical initiating system consisting of one or more compounds with at least one of the compounds being capable of fast thermal decomposition or evaporation at an elevated temperature between 50 and 300° C., and (b) a combination of a photosensitive free radical initiating system, and a compound capable of thermally generating a new compound at an elevated temperature between 50 and 300° C., said new compound being capable of fully or partially deactivating the photoinitiation capability of the photosensitive free radical initiating system.

27. The method of claim 26 wherein said thermo-deactivatable photosensitive free radical initiating system is a photosensitive free radical initiating system having one or more compounds with at least one of the compounds having a thermal decomposition temperature of between 50 and 300° C.

28. The method of claim 26 wherein said thermal-deactivatable photosensitive free radical initiating system consists of a photosensitive free radical initiating system capable of actinically generating an α-aminoalkyl radical, and a compound capable of thermally generating a Bronsted acid at an elevated temperature between 50 and 300° C.

29. The method of claim 26 wherein said photosensitive layer further includes a polymeric binder with or without acrylate or methacrylate functional groups.

30. The method of claim 25 wherein said actinic radiation is an ultraviolet light.

31. The method of claim 25 wherein said substrate is hydrophilic and said photosensitive layer is oleophilic, and said plate is a wet lithographic plate.

32. The method of claim 25 wherein said substrate is oleophilic and said photosensitive layer is oleophobic, and said plate is a waterless lithographic plate.

33. The method of claim 25 wherein said substrate is hydrophilic and said photosensitive layer is oleophilic, and said plate further includes a top water soluble or dispersible polymer layer on the photosensitive layer.

34. The method of claim 25 wherein said imagewise infrared laser exposure, overall actinic light exposure, and on-press development are all carried out with the plate being mounted on the same plate cylinder of the press.

* * * * *